(12) United States Patent
Tokuda

(10) Patent No.: US 11,245,386 B2
(45) Date of Patent: Feb. 8, 2022

(54) HIGH-FREQUENCY MODULE

(71) Applicant: MURATA MANUFACTURING CO., LTD., Kyoto-fu (JP)

(72) Inventor: Daisuke Tokuda, Kyoto-fu (JP)

(73) Assignee: Murata Manufacturing, Kyoto-fu (JP)

( * ) Notice: Subject to any disclaimer, the term of this patent is extended or adjusted under 35 U.S.C. 154(b) by 348 days.

(21) Appl. No.: 14/170,248

(22) Filed: Jan. 31, 2014

(65) Prior Publication Data
US 2014/0145898 A1    May 29, 2014

Related U.S. Application Data

(63) Continuation of application No. PCT/JP2012/069067, filed on Jul. 27, 2012.

(30) Foreign Application Priority Data

Aug. 1, 2011    (JP) .............................. JP2011-167926

(51) Int. Cl.
*H03H 11/02*    (2006.01)
*H03H 7/01*    (2006.01)
(Continued)

(52) U.S. Cl.
CPC ......... *H03H 11/02* (2013.01); *H01L 23/5223* (2013.01); *H01L 23/5227* (2013.01);
(Continued)

(58) Field of Classification Search
CPC combination set(s) only.
See application file for complete search history.

(56) References Cited

U.S. PATENT DOCUMENTS

| 5,889,319 A | 3/1999 | Moller et al. |
| 6,168,969 B1 | 1/2001 | Farnworth |

(Continued)

FOREIGN PATENT DOCUMENTS

| CN | 1230290 A | 9/1999 |
| CN | 1306386 A | 8/2001 |

(Continued)

OTHER PUBLICATIONS

"Notice of the first Office Action," issued by the State Intellectual Property of the People's Republic of China dated Sep. 19, 2014, which corresponds to Chinese Patent Application No. 201280037548.2 and is related to U.S. Appl. No. 14/170,248; with English language translation.

(Continued)

*Primary Examiner* — Zhiyu Lu
(74) *Attorney, Agent, or Firm* — Studebaker & Brackett PC

(57) ABSTRACT

A high-frequency module includes a semiconductor chip device that is mounted on an external circuit substrate by wire bonding. A switch forming section, a power amplifier forming section and a low noise amplifier forming section, realized by a group of FETs, which are active elements, are formed in the semiconductor chip device. Flat plate electrodes, which form capacitors are formed in the semiconductor chip device. Conductor wires that connect the external circuit substrate and the semiconductor chip device function as inductors. A group of passive elements that includes inductors and capacitors is formed. As a result, a high-frequency module that can be reduced in size while still obtaining the required transmission characteristic is realized.

5 Claims, 5 Drawing Sheets

(51) Int. Cl.
*H01L 23/522* (2006.01)
*H04B 1/04* (2006.01)
*H01L 23/64* (2006.01)
*H01L 23/66* (2006.01)
*H04B 1/18* (2006.01)
*H01L 25/16* (2006.01)
*H01P 1/201* (2006.01)
*H01Q 1/50* (2006.01)
*H03H 1/00* (2006.01)
*H03H 7/46* (2006.01)

(52) U.S. Cl.
CPC .......... *H01L 23/642* (2013.01); *H01L 23/645* (2013.01); *H01L 23/66* (2013.01); *H01L 25/16* (2013.01); *H01P 1/201* (2013.01); *H01Q 1/50* (2013.01); *H03H 7/0115* (2013.01); *H03H 7/1708* (2013.01); *H03H 7/1775* (2013.01); *H04B 1/0458* (2013.01); *H04B 1/18* (2013.01); *H01L 2223/6611* (2013.01); *H01L 2223/6644* (2013.01); *H01L 2223/6672* (2013.01); *H01L 2224/48091* (2013.01); *H01L 2924/3011* (2013.01); *H01L 2924/30107* (2013.01); *H03H 7/463* (2013.01); *H03H 2001/0064* (2013.01); *H03H 2001/0078* (2013.01)

(56) References Cited

U.S. PATENT DOCUMENTS

| | | | | |
|---|---|---|---|---|
| 6,424,223 B1* | 7/2002 | Wang | | H01L 23/66 330/286 |
| 6,680,533 B1* | 1/2004 | Miyazawa | | H01L 23/13 257/728 |
| 7,378,733 B1* | 5/2008 | Hoang | | H01L 23/50 257/724 |
| 7,618,846 B1* | 11/2009 | Pagaila | | H01L 24/96 438/113 |
| 2002/0074669 A1 | 6/2002 | Watanabe et al. | | |
| 2002/0079971 A1* | 6/2002 | Vathulya | | H03F 1/223 330/311 |
| 2003/0058066 A1 | 3/2003 | Taniguchi et al. | | |
| 2004/0087286 A1* | 5/2004 | Inoue | | H01P 1/15 455/130 |
| 2004/0104790 A1 | 6/2004 | Nishihara et al. | | |
| 2004/0152276 A1* | 8/2004 | Nishimura | | H01Q 23/00 438/365 |
| 2005/0077980 A1* | 4/2005 | Watanabe | | H01P 1/15 333/126 |
| 2005/0176380 A1* | 8/2005 | Okabe | | H04B 1/38 455/73 |
| 2005/0237130 A1 | 10/2005 | Iwamoto et al. | | |
| 2005/0285234 A1* | 12/2005 | Kanno | | H01L 23/66 257/664 |
| 2007/0007622 A1* | 1/2007 | Liu | | H01L 23/642 257/531 |
| 2009/0206948 A1* | 8/2009 | Kemmochi | | H04B 1/0057 333/126 |
| 2009/0273413 A1* | 11/2009 | Zhang | | H01P 5/12 333/124 |
| 2010/0072604 A1* | 3/2010 | Komatsu | | H01L 23/481 257/691 |
| 2010/0108370 A1* | 5/2010 | Kapusta | | H05K 1/181 174/260 |
| 2010/0123215 A1* | 5/2010 | Pan | | H01L 23/49816 257/532 |
| 2011/0294443 A1* | 12/2011 | Nohra | | H04B 1/48 455/78 |

FOREIGN PATENT DOCUMENTS

| | | |
|---|---|---|
| CN | 1394389 A | 1/2003 |
| CN | 1495997 A | 5/2004 |
| CN | 1540688 A | 10/2004 |
| CN | 1691501 A | 11/2005 |
| EP | 0921642 A2 | 6/1999 |
| EP | 1315305 A1 | 5/2003 |
| JP | 10-093302 A | 4/1998 |
| JP | 11-168303 A | 6/1999 |

OTHER PUBLICATIONS

International Search Report; PCT/JP2012/069067; dated Sep. 25, 2012.
Written Opinion of the International Searching Authority; PCT/JP2012/069067; dated Sep. 25, 2012.
"Notification of the Second Office Action," issued by the State Intellectual Property of the People's Republic of China dated Apr. 7, 2015, which corresponds to Chinese Patent Application No. 201280037548.2 and is related to U.S. Appl. No. 14/170,248; with English language translation.
The extended European search report issued by the European Patent Office dated Apr. 9, 2015, which corresponds to European Patent Application No. 12820197.7-1552 and is related to U.S. Appl. No. 14/170,248.
"Notification of the Third Office Action," issued by the State Intellectual Property of the People's Republic of China dated Aug. 13, 2015, which corresponds to Chinese Patent Application No. 201280037548.2 and is related to U.S. Appl. No. 14/170,248; with English language translation.

* cited by examiner

HIGH-FREQUENCY MODULE

CROSS REFERENCE TO RELATED APPLICATION

This application claims benefit of priority to Japanese Patent Application No. 2011-167926 filed Aug. 1, 2011, and to International Patent Application No. PCT/JP2012/069097 filed on Jul. 27, 2012, the entire content of each of which is incorporated herein by reference.

TECHNICAL FIELD

The technical field relates to high-frequency modules that contain a circuit formed of passive elements and a circuit including an active element.

BACKGROUND

Currently, in wireless communication terminals such as cellular phones, it is common for a single antenna to be shared by a plurality of communication systems. In order to realize such sharing of an antenna, wireless communication terminals of the related art include a switch circuit that performs switching to connect an antenna to transmission/reception circuits of the communication systems. In addition, due to current restrictions such as regulation of harmonics, a filter circuit such as a band pass filter is sometimes connected to an antenna connection terminal in order to ensure that unwanted waves such as harmonic signals and noise are not transmitted from the antenna to the outside. Therefore, in current cellular phones, a high-frequency module is sometimes employed in which an antenna and a switch circuit are connected to each other via a band pass filter.

In such a high-frequency module of the related art, the bandpass filter is formed of passive elements such as inductors and capacitors. The switch circuit includes an active element such as an FET.

In addition, the bandpass filter and the switch circuit are formed so as to be grouped together on a single base substrate, as illustrated in Japanese Unexamined Patent Application Publication No. 2005-229057. FIG. 8 is a plan view giving an outline illustration of the structure of a high-frequency module 10P of the related art. In FIG. 8, patterns that connect the individual elements to lands, which are connected to external circuits, are omitted.

A switch (SW) forming section 101, a power amplifier (PA) forming section 102, and a low noise amplifier (LNA) forming section 103, which are formed of a group of active elements, are formed on a base substrate 100P composed of a semiconductor. In addition, spiral electrodes 111P, 112P and 113P, which form inductors, which are passive elements included in a bandpass filter, and flat plate electrodes, which form capacitors 121, 122 and 123, which are passive elements included in the bandpass filter, are formed on the base substrate 100P. In addition, land electrodes 131P, 141P, 142P, 143P, 151P, 152P and 153P for allowing connection to external circuits are formed separately from the above-described electrodes on the front surface of the base substrate 100P.

SUMMARY

Technical Problem

When a band pass filter, which is composed of a group of passive elements, is formed on the same substrate as the SW and other elements composed of the group of active elements, as illustrated in FIG. 8, the area of a passive circuit forming region 902P, in which the band pass filter is formed, is generally larger than an active circuit forming region 901P, in which the SW and other elements are formed. This is because the spiral electrodes 111P, 112P and 113P, which form inductors included in the group of passive elements, are larger than the other circuit elements. Therefore, there is a problem that the high-frequency module is increased in size. In addition, when attempting to form inductors with high Q values in order to improve the characteristics of the bandpass filter, the electrode width and electrode interval of the spiral electrodes have to be large and the area occupied by the inductors is large. Therefore, there is a problem that the high-frequency module is increased in size.

Therefore, an object of the present disclosure is to provide a high-frequency module that can be of reduced size while still obtaining the required transmission characteristic.

Solution to Problem

A high-frequency module of the present disclosure includes a first circuit composed of a group of passive elements including at least one inductor and at least one capacitor, and a second circuit including at least one active element. In the high-frequency module, the capacitor of the first circuit and the active element of the second circuit are formed in a single chip device.

In this configuration, since the inductor, which requires a large formation area among the group of passive elements, does not have to be formed in the chip device in which the capacitor is formed, the size of the chip device is reduced. At this time, provided that the inductor is realized by at least one of a lead electrode formed on the chip device, a bonding wire (which will be described later) and a pattern electrode formed on an external circuit substrate on which the chip device is to be mounted, the first circuit can be formed.

In addition, it is preferable that the inductor of the high-frequency module of the present disclosure be implemented so as to include a conductive wire used to mount the chip device on an external circuit substrate.

In this configuration, the inductor is realized with a conductive wire (bonding wire) and the inductor of the first circuit can be realized without forming pattern electrodes for the inductor on the chip device and the external circuit substrate. Thus, the high-frequency module can be reduced in size. In addition, since a conductive wire (bonding wire) is basically required to connect the chip device to the external circuit substrate, the conductive wire doubles as both a connection conductive wire and the inductor, enabling a further reduction in size of the high-frequency module.

In addition, it is preferable that the high-frequency module of the present disclosure have the following configuration. In the high-frequency module, the inductor and the capacitor are grounded. The chip device of the high-frequency module includes a ground via that grounds the capacitor. In addition, a land, which is formed on the external circuit substrate and to which a conductive wire is bonded, and an electrode, which is formed on the external circuit substrate and is connected to the ground via, form an integrated common ground electrode.

In this configuration, in the case of a circuit configuration where the inductor and the capacitor are to be grounded, a common ground electrode is provided as the ground electrode for the inductor and the ground electrode for the capacitor. Thus, the transmission characteristic of the first circuit, which is not affected by the impedance (inductance, etc.) of the external circuit substrate, is stabilized.

In addition, in the high-frequency module of the present disclosure, it is preferable that the first circuit be a band pass filter connected to an antenna and that the second circuit be a switch circuit connected to the bandpass filter.

In this configuration, specific examples of the first circuit and the second circuit are given. Thus, by applying a bandpass filter to the first circuit and a switch circuit to the second circuit, the above-described configuration can be applied to a wireless communication front end circuit. Therefore, a high-frequency module for a wireless communication front-end circuit can be reduced in size.

Advantageous Effects of Disclosure

According to the present disclosure, a high-frequency module that includes a circuit composed of a group of passive elements and a circuit composed of a group of active elements can be formed in a compact size while still obtaining a required transmission characteristic.

DETAILED DESCRIPTION

Figure 1A:
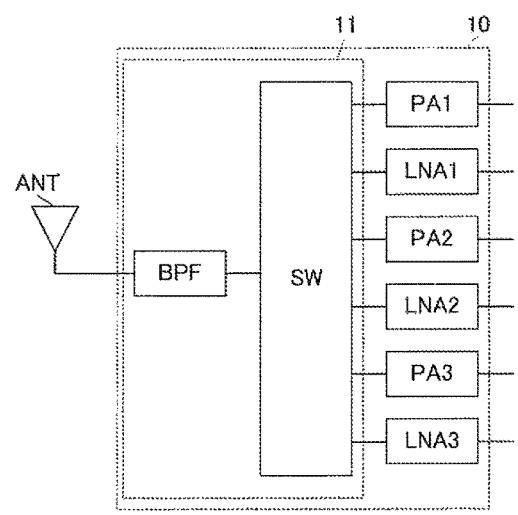
FIG. 1A is a circuit block diagram of a high-frequency module according to an embodiment of the present disclosure.
Figure 1B:
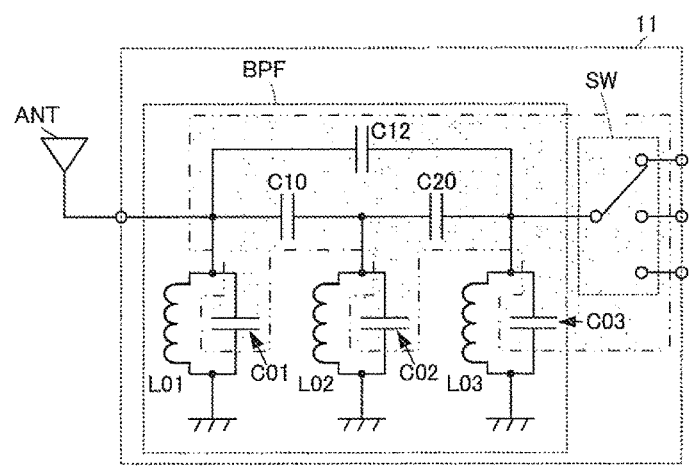
FIG. 1B is a circuit block diagram of a composite circuit including a bandpass filter and a switch included in the high-frequency module according to an embodiment of the present disclosure.
Figure 2:
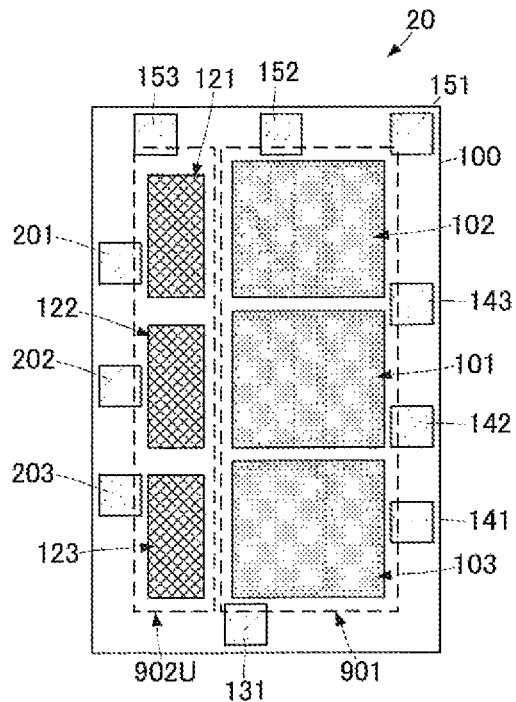
FIG. 2 is a plan view of a semiconductor chip device that forms part of a high-frequency module according to a first embodiment of the present disclosure.
Figure 3:
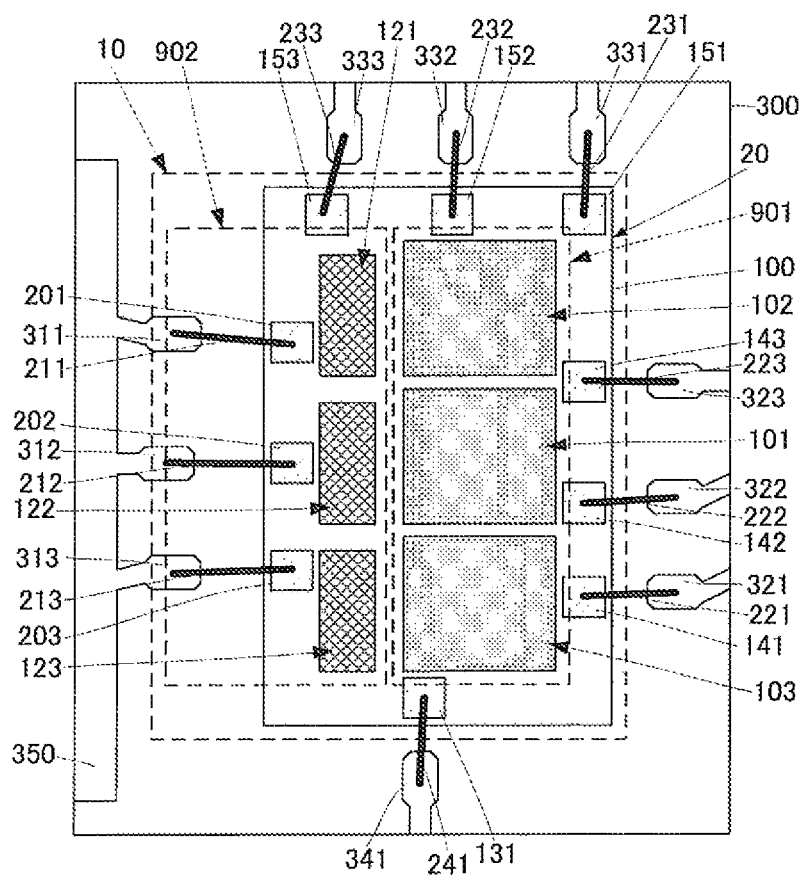
FIG. 3 is a plan view of the high-frequency module according to the first embodiment of the present disclosure.
Figure 4:
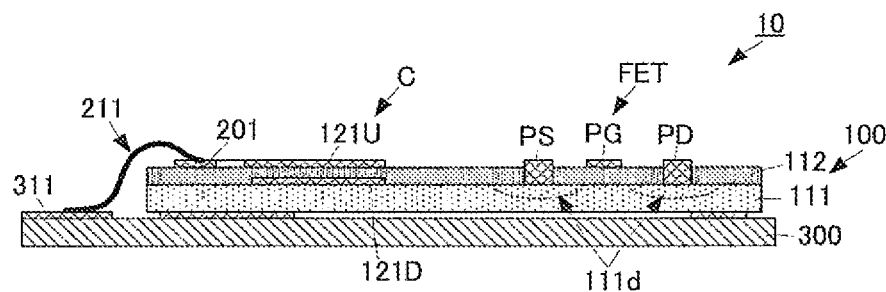
FIG. 4 is a side sectional view illustrating an outline configuration of the high-frequency module according to the first embodiment of the present disclosure.

A high-frequency module according to a first embodiment of the present disclosure will be described with reference to the drawings. FIG. 1A is a circuit block diagram of a high-frequency module 10 according to this embodiment of the present disclosure and FIG. 1B is a circuit block diagram of a composite circuit 11 including a bandpass filter BPF and a switch SW included in the high-frequency module 10. FIG. 2 is a plan view of a semiconductor chip device 20 that forms part of the high-frequency module 10 according to the first embodiment of the present disclosure. FIG. 3 is a plan view of the high-frequency module 10 according to the first embodiment of the present disclosure. FIG. 4 is a side sectional view illustrating an outline configuration of the high-frequency module 10 according to the first embodiment of the present disclosure. In addition, FIG. 2, FIG. 3 and FIG. 4 are diagrams for easily explaining only structures that are characteristic of the disclosure of the present application and patterns providing connections between individual elements and therefore detailed patterns for forming the circuits of FIGS. 1A and 1B are appropriately omitted therefrom. In addition, the number of capacitors is different (fewer) in FIG. 2, FIG. 3 and FIG. 4 than in the circuit configuration of FIGS. 1A and 1B. This is because illustration of some of these capacitors has been omitted in order to make the explanation easier to understand, and in reality the capacitors are formed in a number according to the circuit configuration.

First, in order to make it easier to understand the structure of the high-frequency module 10, the structure being mentioned later, the circuit configuration of the high-frequency module 10 of this embodiment will be described with reference to FIGS. 1A and 1B.

The high-frequency module 10 includes the band pass filter BPF, the switch SW, power amplifiers PA1, PA2 and PA3, and low noise amplifiers LNA1, LNA2 and LNA3. The composite circuit 11 is formed by the bandpass filter BPF and the switch SW.

The switch SW selectively connects any of the power amplifiers PA1, PA2, PA3 and the low noise amplifiers LNA1, LNA2 and LNA3 to the bandpass filter BPF. The power amplifier PA1 and the low noise amplifier LNA1 are for first communication signals having a first frequency band as a usage band. The power amplifier PA2 and the low noise amplifier LNA2 are for second communication signals having a second frequency band as a usage band. The power amplifier PA3 and the low noise amplifier LNA3 are for third communication signals having a third frequency band as a usage band. The frequency bands of the first communication signals, the second communication signals, and the third communication signals may partially overlap but do not entirely overlap.

The power amplifier PA1 amplifies a transmission signal of the first communication signals from an external circuit and outputs the amplified transmission signal to the switch SW. The power amplifier PA2 amplifies a transmission signal of the second communication signals from an external circuit and outputs the amplified transmission signal to the switch SW. The power amplifier PA3 amplifies a transmission signal of the third communication signals from an external circuit and outputs the amplified transmission signal to the switch SW. The low noise amplifier LNA1 amplifies a reception signal of the first communication signals from the switch SW and outputs the amplified reception signal to an external circuit. The low noise amplifier LNA2 amplifies a reception signal of the second communication signals from the switch SW and outputs the amplified reception signal to an external circuit. The low noise amplifier LNA3 amplifies a reception signal of the third communication signals from the switch SW and outputs the amplified reception signal to an external circuit.

One terminal of the bandpass filter BPF is connected to the switch SW and the other terminal of the bandpass filter BPF is connected to an antenna ANT. The bandpass filter BPF is a bandpass filter having pass bands that are set to match the frequency bands of the first, second and third communication signals and attenuated bands that are set to match frequency bands other than the frequency bands of the first, second, and third communication signals. It is preferable that the bandpass filter BPF have a characteristic that attenuation of harmonic components of the communication signals can be sufficiently secured, and in particular, that there be an attenuation pole on the upper limit side and the lower limit side of each of the passbands.

Accordingly, the bandpass filter BPF has the circuit configuration illustrated in FIG. 1B. In the bandpass filter BPF, a series circuit formed of capacitors C10 and C20 is connected between an antenna ANT side terminal and a switch SW side terminal. The antenna ANT end of the capacitor C10 is grounded via a parallel circuit formed of an inductor L01 and a capacitor C01. A connection point between the capacitor C10 and the capacitor C20 is grounded via a parallel circuit formed of an inductor L02 and a capacitor C02. The switch SW end of the capacitor C20 is grounded via a parallel circuit formed of an inductor L03 and a capacitor C03. A capacitor C12 is connected in parallel with the series circuit formed of the capacitors C10 and C20. With this circuit configuration, a band pass filter can be realized that has a transmission characteristic including the above-described pass characteristic and attenuation characteristic.

The high-frequency module 10 having the above-described circuit configuration, as illustrated in FIG. 2, FIG. 3 and FIG. 4, is realized by mounting the semiconductor chip device 20 on an external circuit substrate 300. The circuit in the area surrounded by the dotted line in FIGS. 1A and 1B is realized by the semiconductor chip device 20.

The semiconductor chip device 20 includes a base substrate 100. The base substrate 100 is formed in a plate-like shape, and as illustrated in FIG. 4 is composed of a semiconductor substrate 111 and an insulating layer 112. The semiconductor substrate 111 is composed of for example a p-type semiconductor and contains n-type doping regions 111$d$ in parts thereof.

Certain electrode patterns and the insulating layer 112 are formed on one main surface (hereafter, front surface) of the semiconductor substrate 111. In addition, certain electrode patterns are formed on the surface of insulating layer 112 on the side opposite to the side where the semiconductor substrate 111 is located.

These electrode patterns are formed so as to realize capacitors C of the bandpass filter BPF, and a group of field effect transistors FETs (hereafter, simply FETs) that are formed so as to realize the switch SW, the power amplifiers PA1, PA2 and PA3, the low noise amplifiers LNA1, LNA2 and LNA3.

As a specific example configuration, as illustrated in FIG. 4, a first flat plate electrode 121D forming part of a capacitor C is formed in a capacitor forming region on the front surface of the semiconductor substrate 111. A second flat plate electrode 121U is formed so as to face the first flat plate electrode 121D over a certain area with the insulating layer 112 therebetween.

In addition, as illustrated in FIG. 4, a source electrode PS and a drain electrode PD are respectively formed in two different n-type doping regions 111$d$ in an FET forming region that includes two adjacent n-type doping regions 111$d$ at the front surface of the semiconductor substrate 111. A gate electrode PG is formed between the source electrode PS and the drain electrode PD on a surface of the insulating layer 112 on the side opposite to the side where the semiconductor substrate 111 is located.

By forming the capacitors C and the FETs with this structure, as illustrated in FIG. 2 and FIG. 3, a switch forming section 101, a power amplifier forming section 102 and a low noise amplifier forming section 103 are formed so as to be arranged on the base substrate 100 when the base substrate 100 is viewed in plan. The above-mentioned power amplifiers PA1, PA2 and PA3 are formed in the power amplifier forming section 102, and the above-mentioned low noise amplifiers LNA1, LNA2 and LNA3 are formed in the low noise amplifier forming section 103. Thus, an active circuit forming region 901 is formed.

In addition, as illustrated in FIG. 2 and FIG. 3, the capacitors 121, 122 and 123 are formed when the base substrate 100 is viewed in plan. Thus, a passive circuit forming region 902U is formed. Thus, by forming the passive circuit forming region 902U on the base substrate 100 using only the capacitors 121, 122 and 123 and not forming an inductor having a large formation area on the base substrate 100, the base substrate 100, which has a semiconductor substrate as a main component, can be formed in a compact size.

In addition to the above-described functional circuit, external connection land electrodes 131, 141, 142, 143, 151, 152, 153, 201, 202, and 203 are formed on the front surface of the base substrate 100 (surface on side on which the FETs and capacitors are formed). These land electrodes are formed so as to be arranged in a certain pattern, and, for example, as illustrated in FIG. 2, the land electrode 131 is formed in the vicinity of a first edge when the base substrate 100 is viewed in plan. The land electrode 131 is an antenna connection land electrode.

The land electrodes 151, 152 and 153 are formed in the vicinity of a second edge that faces the first edge. The land electrodes 151, 152 and 153 are transmission signal input lands.

The land electrodes 141, 142 and 143 are formed in the vicinity of a third edge that is orthogonal to the first edge and the second edge. The land electrodes 141, 142 and 143 are reception signal output lands.

The land electrodes 201, 202 and 203 are formed in the vicinity of a fourth edge that faces the third edge. The land electrodes 201, 202 and 203 are lands used for forming conductive wires that constitute inductors.

The semiconductor chip device 20 having the above-described configuration, as illustrated in FIG. 3, is mounted on the external circuit substrate 300 in a so-called face up state such that each of the above-described land electrodes faces toward the side opposite to the external circuit substrate 300 side. At this time, the semiconductor chip device 20 is mounted on the external circuit substrate 300 with a conductive or insulating adhesive in accordance with the specifications.

Substrate land electrodes 311, 312 and 313 for ground connection are formed on the external circuit substrate 300. The substrate land electrodes 311, 312 and 313 are connected to a ground electrode 350. The substrate land electrodes 311, 312 and 313 are arranged so as to face the land electrodes 201, 202 and 203 of the semiconductor chip device 20. The substrate land electrode 311 and the land 201 are hardwired to each other by wire bonding using Cu. In this way, the substrate land electrode 311 and the land 201 are connected to each other by a conductive wire 211 having a certain loop-like shape. The length and thickness of the conductive wire 211 are set such that the required inductance for the above-described inductor L01 is obtained.

The substrate land electrode 312 and the land 202 are hardwired to each other by wire bonding using Cu. In this way, the substrate land electrode 312 and the land 202 are connected to each other by a conductive wire 212 having a certain loop-like shape. The length and thickness of the conductive wire 212 are set such that the required inductance for the above-described inductor L02 is obtained.

The substrate land electrode 313 and the land 203 are hardwired to each other by wire bonding using Cu. In this way, the substrate land electrode 313 and the land 203 are connected to each other by a conductive wire 213 having a certain loop-like shape. The length and thickness of the conductive wire 213 are set such that the required inductance for the above-described inductor L03 is obtained.

In addition, it is preferable that the wires be thick so that good Q values are obtained.

In addition, in this embodiment, Cu is used as the material of the wires but for example Au or Ag can be used instead. Cu has a higher material conductivity than Au, and Ag has a still higher material conductivity than Cu. Consequently, it is preferable to use Cu or Ag as the material forming the wires.

Thus, the inductors are realized by the conductive wires 211, 212 and 213, whereby the bandpass filter BPF can be realized even though no inductors are formed on the semiconductor chip device 20. Then, by utilizing the inductors composed of these conductive wires 211, 212 and 213, the passive circuit forming region 902, in which the inductors and capacitors are formed, can be reduced in size, whereby it is possible to reduce the size of the high-frequency module 10. In addition, by using the conductive wires 211, 212 and 213, inductors having a smaller area and a higher Q value can be realized compared with the case where planar spiral electrodes are used. Thus, a compact high-frequency module having an excellent transmission characteristic (pass characteristic and attenuation characteristic) can be realized.

In addition, these conductive wires 211, 212 and 213 are formed substantially parallel to each other with a certain interval therebetween. With this configuration, the area dedicated to the inductor forming region can be further reduced. Thus, a compact high-frequency module having excellent characteristics can be realized.

Substrate land electrodes 321, 322 and 323 for output of reception signals are formed on the external circuit substrate 300. The substrate land electrodes 321, 322 and 323 are arranged so as to face the land electrodes 141, 142 and 143 of the semiconductor chip device 20. The substrate land electrodes 321, 322 and 323 and the land electrodes 141, 142 and 143 are respectively hardwired to each other by wire bonding. Thus, the substrate land electrode 321 and the land electrode 141 are connected to each other by a conductive wire 221, the substrate land electrode 322 and the land electrode 142 are connected to each other by a conductive wire 222 and the substrate land electrode 323 and the land electrode 143 are connected to each other by a conductive wire 223.

Substrate land electrodes 331, 332 and 333 for input of transmission signals are formed on the external circuit substrate 300. The substrate land electrodes 331, 332 and 333 are arranged so as to face the land electrodes 151, 152 and 153 of the semiconductor chip device 20. The substrate land electrodes 331, 332 and 333 and the land electrodes 151, 152 and 153 are respectively hardwired to each other by wire bonding. Thus, the substrate land electrode 331 and the land electrode 151 are connected to each other by a conductive wire 231, the substrate land electrode 332 and the land electrode 152 are connected to each other by a conductive wire 232 and the substrate land electrode 333 and the land electrode 153 are connected to each other by a conductive wire 233.

A substrate land electrode 341 for the antenna is formed on the external circuit substrate 300. The substrate land electrode 341 is arranged so as to face the land electrode 131 of the semiconductor chip device 20. The substrate land electrode 341 and the land electrode 131 are hardwired to each other by wire bonding. Thus, the substrate land electrode 341 and the land electrode 131 are connected to each other by a conductive wire 241.

By using the above-described configuration, a high-frequency module that includes a circuit composed of a group of passive elements and a circuit including a group of active elements can be formed in a compact size while still having an excellent transmission characteristic.

Figure 5:
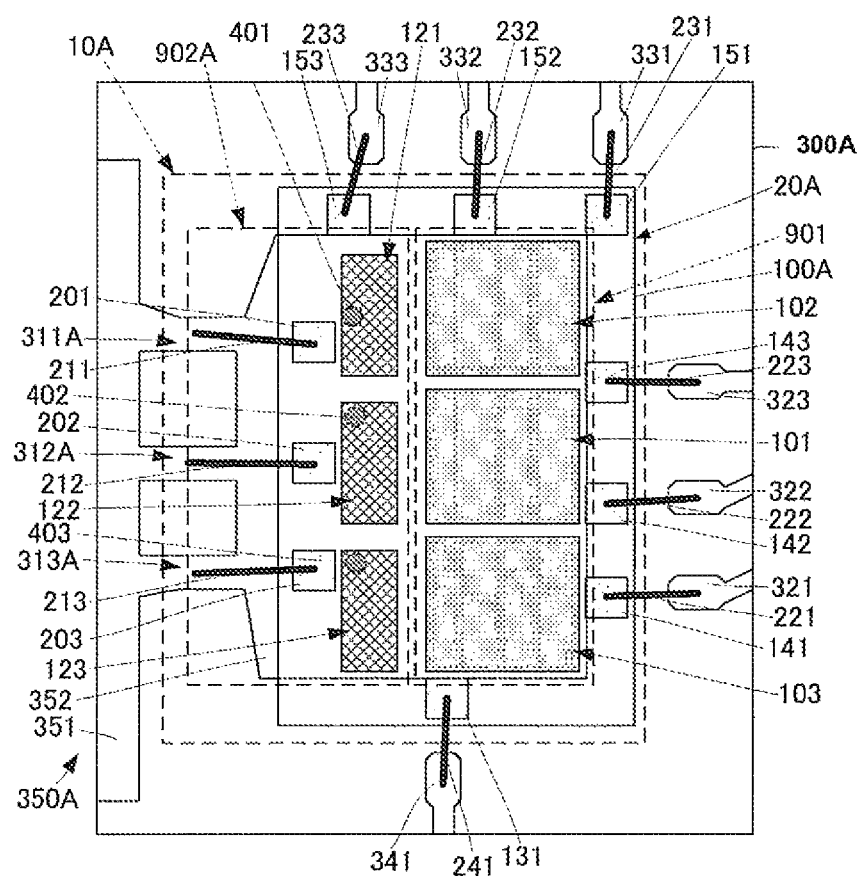
FIG. 5 is a plan view illustrating a mounting state of a high-frequency module according to a second embodiment of the present disclosure.
Figure 6:
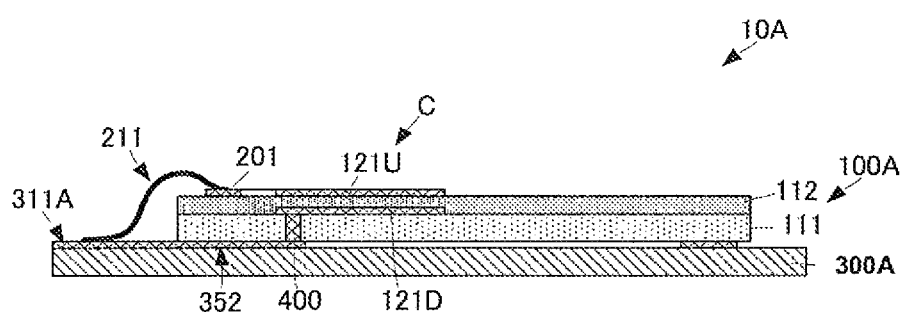
FIG. 6 is a side sectional view of the high-frequency module according to the second embodiment of the present disclosure.

Next, a high-frequency module according to a second embodiment of the present disclosure will be described with reference to the drawings. FIG. 5 is a plan view illustrating a mounting state of a high-frequency module 10A according to the second embodiment of the present disclosure. FIG. 6 is a side sectional view of the high-frequency module 10A according to the second embodiment of the present disclosure. Similarly to as in FIG. 2 and FIG. 3, certain structures are appropriately omitted from the illustrations in FIG. 5 and FIG. 6 in order to make it easier to understand the structures that are characteristic of the present disclosure.

The high-frequency module 10A of this embodiment is the same as the high-frequency module 10 described in the first embodiment, except for the provision of ground via electrodes 401, 402 and 403, and the provision of a common ground electrode 350A on an external circuit substrate 300A. Therefore, only these differences will be described.

The ground via electrodes 401, 402 and 403 are formed in through holes that penetrate from the front surface (surface on which insulating layer 112 is formed) to the back surface (surface abutting external circuit substrate 300A) of the semiconductor substrate 111. The insides of the through holes are filled with a conductive material. The ground via electrodes 401, 402 and 403 bring the capacitors on the front surface of the semiconductor substrate 111 and ground connection electrodes (not illustrated) on the back surface side of the semiconductor substrate 111 into conductive contact with each other. In addition, the ground via electrodes 401, 402 and 403 are not limited to being formed within the area where the flat plate electrodes of the capacitors are formed and may instead be formed in the vicinity of the flat plate electrodes of the capacitors.

A device ground electrode 352 is formed on the front surface (mounting surface for semiconductor chip device 20A) of the external circuit substrate 300A so as to include a region related to the semiconductor chip device 20A in a passive circuit forming region 902A of the high-frequency module 10A. The device ground electrode 352 is formed so as to be integrated with substrate land electrodes 311A, 312A and 313A and a common electrode 351 commonly connected to these substrate land electrodes. Thus, the ground electrode 350A is formed so as to be shared by the inductors and capacitors.

Figure 7A:
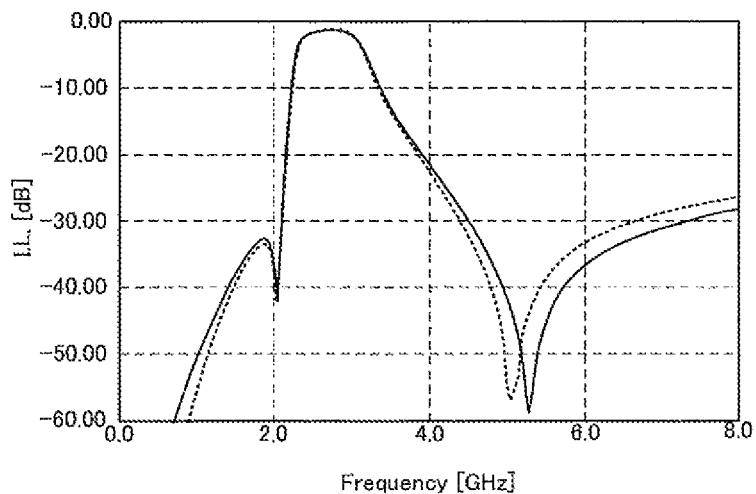
FIG. 7A illustrates a pass characteristic of a band pass filter of the high-frequency module according to the second embodiment.
Figure 7B:
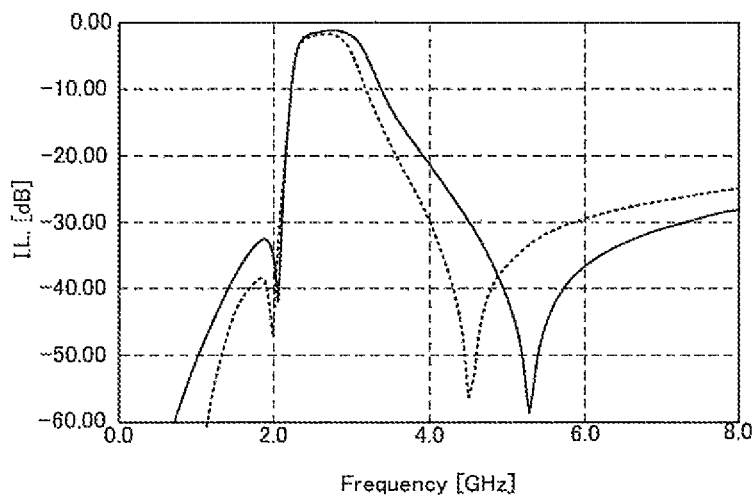
FIG. 7B illustrates a pass characteristic of a band pass filter of the high-frequency module according to the first embodiment.
Figure 8:
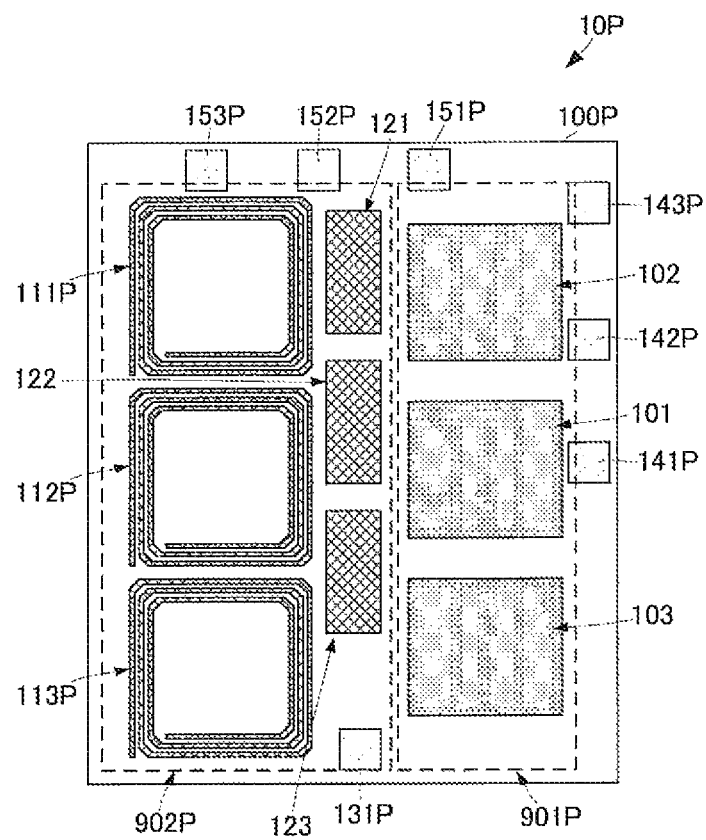
FIG. 8 is a plan view giving an outline illustration of the structure of a high-frequency module of the related art.

Thus, a common ground electrode for grounding both the inductors and the capacitors is provided, whereby the following effect is obtained. FIG. 7A illustrates a pass characteristic of the bandpass filter of the high-frequency module 10A according to the second embodiment and FIG. 7B illustrates a pass characteristic of the bandpass filter of the high-frequency module 10 according to the first embodiment. In each of the figures, the pass characteristic represented by a broken line and the pass characteristic represented by a solid line are for difference impedances (inductances) of the external circuit substrate.

As illustrated in FIG. 7, by using the configuration of the high-frequency module 10A according to the second embodiment, the effect of the impedance of the external circuit substrate can be reduced. That is, by providing a common ground for the inductors and the capacitors, a high-frequency module having a stable pass characteristic can be realized. Thus, by using the configuration of the second embodiment, a high-frequency module that can obtain excellent characteristics more stably can be formed in a compact size.

In addition, in each of the above-described embodiments, a high-frequency module that includes a band pass filter BPF, a switch SW, power amplifiers PA and low noise amplifiers LNA was described as an example but the present disclosure is not limited to this. So long as a high-frequency module includes at least one circuit composed of a group of passive elements including at least one inductor and at least one capacitor, and at least one circuit that includes at least one active element, the above-described configurations can be applied thereto.

The invention claimed is:

1. A high-frequency module comprising:
    a first circuit composed of a group of passive elements including at least one inductor and at least one capacitor, and
    a second circuit including at least one active element, the at least one capacitor of the first circuit and the at least one active element of the second circuit being formed in a single chip device, wherein
    the at least one inductor includes a conductive wire to mount the single chip device on an external circuit substrate,
    the inductor and the capacitor are directly grounded to a common ground electrode,
    the chip device includes a ground via that grounds the capacitor,
    the common ground electrode is formed on an external circuit substrate and includes a land to which the conductive wire is bonded, the common ground electrode also being connected to the ground via,
    a land electrode used for forming the conductive wire is also formed in the single chip device, and
    the land electrode and the capacitor are directly connected to the same substrate.

2. The high-frequency module according to claim 1, wherein
    the first circuit is a band pass filter connected to an antenna, and
    the second circuit is a switch circuit that is connected to the bandpass filter.

3. A high-frequency module comprising:
    a plurality of high-frequency circuits with each high-frequency circuit including
        a first circuit composed of a group of passive elements including at least one inductor and at least one capacitor, and
        a second circuit including at least one active element, the at least one capacitor of the first circuit and the at least one active element of the second circuit being formed in a single chip device, wherein
        the at least one inductor includes a conductive wire to mount the single chip device on an external circuit substrate,
        the inductor and the capacitor are directly grounded to a common ground electrode, and
        the chip device includes a ground via that grounds the capacitor, and
    an integrated common ground electrode formed on an external circuit substrate, wherein
    the integrated common ground electrode is used by each high-frequency circuit such that the integrated common ground electrode includes a respective land to which a corresponding conductive wire of each high-frequency circuit is bonded,
    the integrated common ground electrode is also connected to a corresponding ground via of each high-frequency circuit,
    a land electrode used for forming the conductive wire is also formed in the single chip device, and
    the land electrode and the capacitor are directly connected to the same substrate.

4. The high-frequency module according to claim 1, wherein
    the at least one inductor is the conductive wire; and
    the at least one inductor is not formed on a base substrate on which the at least one capacitor is formed.

5. The high-frequency module according to claim 3, wherein
    the at least one inductor is the conductive wire; and
    the at least one inductor is not formed on a base substrate on which the at least one capacitor is formed.

* * * * *